(12) United States Patent
Iijima et al.

(10) Patent No.: US 9,964,595 B2
(45) Date of Patent: May 8, 2018

(54) REGISTER CIRCUIT

(71) Applicant: Murata Manufacturing Co., Ltd., Kyoto (JP)

(72) Inventors: Masanori Iijima, Kyoto (JP); Yuji Shintomi, Kyoto (JP); Satoshi Matsumura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/672,632

(22) Filed: Aug. 9, 2017

(65) Prior Publication Data

US 2017/0336474 A1 Nov. 23, 2017

Related U.S. Application Data

(63) Continuation of application No. PCT/JP2015/079743, filed on Oct. 21, 2015.

(30) Foreign Application Priority Data

Feb. 9, 2015 (JP) ................................. 2015-023440

(51) Int. Cl.
| | |
|---|---|
| *H03K 3/037* | (2006.01) |
| *G01R 31/3185* | (2006.01) |
| *H03K 3/356* | (2006.01) |
| *H03K 19/21* | (2006.01) |
| *H03K 19/00* | (2006.01) |
| *H03K 19/096* | (2006.01) |

(Continued)

(52) U.S. Cl.
CPC ...... *G01R 31/318541* (2013.01); *G11C 19/28* (2013.01); *H03K 3/0372* (2013.01); *H03K 3/356156* (2013.01); *H03K 19/0002* (2013.01); *H03K 19/096* (2013.01); *H03K 19/215* (2013.01); *H03K 23/005* (2013.01); *H03K 23/425* (2013.01)

(58) Field of Classification Search
None
See application file for complete search history.

(56) References Cited

U.S. PATENT DOCUMENTS

| | | | |
|---|---|---|---|
| 8,510,487 B2 * | 8/2013 | Ruberg | ............ H04L 29/10 710/313 |
| 8,743,633 B2 * | 6/2014 | Aoki | ............ G11C 29/022 365/189.05 |

(Continued)

FOREIGN PATENT DOCUMENTS

| | | |
|---|---|---|
| JP | H07-170155 A | 7/1995 |
| JP | 2009-027424 A | 2/2009 |
| JP | 2013-520081 A | 5/2013 |

OTHER PUBLICATIONS

International Search Report issued in Application No. PCT/JP2015/079743 dated Nov. 17, 2015.

(Continued)

*Primary Examiner* — Patrick O'Neill
(74) *Attorney, Agent, or Firm* — Pearne and Gordon LLP (57) ABSTRACT

A register circuit for which an initial value can be changed without using a flip-flop including both a set terminal and a reset terminal is provided. The register circuit includes an initial value wiring line, a write signal terminal, a clock signal terminal, a first flip-flop, an output control circuit, a second flip-flop, and a selector.

8 Claims, 8 Drawing Sheets

(51) Int. Cl.
    *G11C 19/28*    (2006.01)
    *H03K 23/00*    (2006.01)
    *H03K 23/42*    (2006.01)

(56) References Cited

U.S. PATENT DOCUMENTS 9,654,114 B2 *   5/2017   Yoshitani .................. H03L 7/00
2011/0196997 A1   8/2011   Ruberg

OTHER PUBLICATIONS

Written Opinion issued in Application No. PCT/JP2015/079743 dated Nov. 17, 2015.

* cited by examiner

REGISTER CIRCUIT

This is a continuation of International Application No. PCT/JP2015/079743 filed on Oct. 21, 2015 which claims priority from Japanese Patent Application No. 2015-023440 filed on Feb. 9, 2015. The contents of these applications are incorporated herein by reference in their entireties.

BACKGROUND

Technical Field

The present disclosure relates to a register circuit.

Register circuits for storing input signals are used in various electronic apparatuses. For example, a register circuit is used to store transfer data in a transfer interface such as a mobile industry processor interface (MIPI) (see, for example, Patent Document 1).

Patent Document 1: Japanese Unexamined Patent Application Publication (Translation of PCT Application) No. 2013-520081

BRIEF SUMMARY

The initial value of a register circuit is determined in accordance with the specifications of an electronic apparatus including the register circuit. For example, the initial value of a 1-bit register circuit is 0 or 1. Such a register circuit for which the initial value of 0 or 1 can be set can be formed with a flip-flop including a set terminal and a reset terminal. However, a flip-flop including both a set terminal and a reset terminal may not be prepared in a standard cell library used for the design of a register circuit.

The present disclosure provides a register circuit for which an initial value can be changed without necessarily a flip-flop including both a set terminal and a reset terminal.

An embodiment of the present disclosure provides a register circuit into which an input signal is input and from which an output signal is output includes an initial value wiring line configured to supply an initial value of the output signal, an input terminal into which the input signal is input; a write signal terminal into which a write signal for making an instruction for writing the input signal is input, a clock signal terminal into which a clock signal is input, a first flip-flop configured to change a value of a first signal from a first value to a second value in accordance with the input clock signal, an output control circuit configured to output the initial value as a second signal in a case where the first signal has the first value and to output the input signal as the second signal in accordance with the write signal in a case where the first signal has the second value, a second flip-flop configured to latch and output the second signal in accordance with the clock signal, and a selector configured to output the initial value supplied from the initial value wiring line as the output signal in a case where the first signal has the first value and to output the second signal supplied from the second flip-flop as the output signal in a case where the first signal has the second value.

According to the present disclosure, it is possible to provide a register circuit for which an initial value can be changed without a flip-flop necessarily including both a set terminal and a reset terminal.

DETAILED DESCRIPTION

Figure 1:
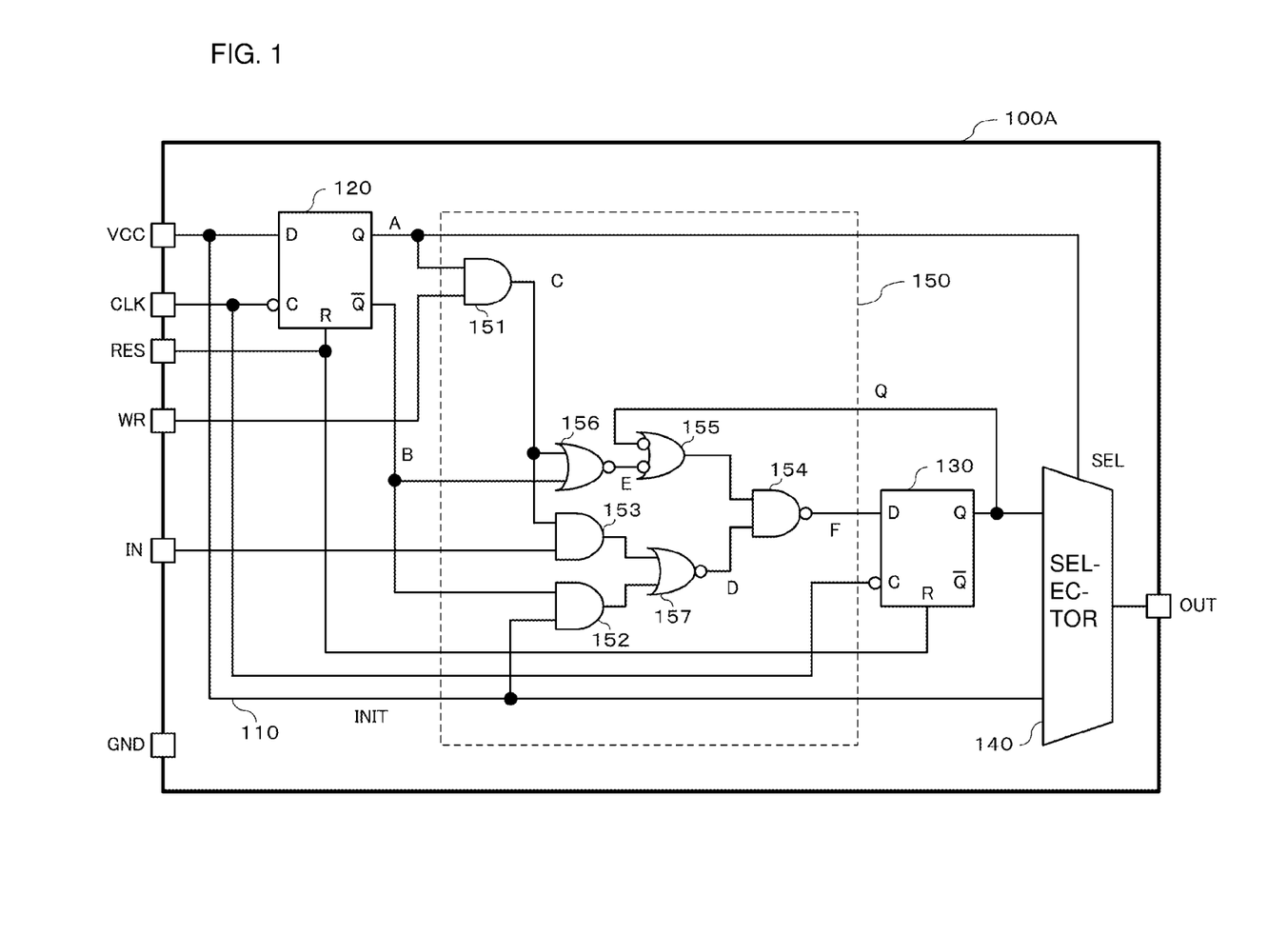
FIG. 1 is a diagram illustrating the configuration of a register circuit 100A according to an embodiment of the present disclosure.

An embodiment of the present disclosure will be described below with reference to the accompanying drawings. FIG. 1 is a diagram illustrating the configuration of a register circuit 100A according to an embodiment of the present disclosure. The register circuit 100A is a circuit for storing 1-bit data (0 or 1). A multi-bit register circuit can be provided using a plurality of register circuits 100A. For example, the register circuit 100A can be used to store transfer data in a transfer interface such as an MIPI. The register circuit 100A may have another use.

As illustrated in FIG. 1, the register circuit 100A includes terminals VCC, CLK, RES, WR, IN, GND, and OUT. The register circuit 100A further includes an initial value wiring line 110. D flip-flops (hereinafter merely referred to as "flip-flops") 120 and 130, a selector 140, and an output control circuit 150.

A power supply voltage for driving the register circuit 100A is supplied to the terminal VCC (power terminal). A clock signal used for the operation of the register circuit 100A is input in to the terminal CLK. A reset signal for resetting the flip-flops 120 and 130 is input into the terminal RES. A write signal for making an instruction for the writing of data into the register circuit 100A is input into the terminal WR. An input signal (0 or 1) to be written into the register circuit 100A is input into the terminal IN. A ground potential is supplied to the terminal GND (grounding terminal). An output signal having a value stored in the register circuit 100A is output from the terminal OUT. A connection relationship between each terminal and a corresponding component is simply illustrated in FIG. 1. For example, although the terminal VCC is connected to each component to supply a power supply voltage, the illustration of these connections is omitted in FIG. 1. For example, although the terminal GND is connected to each component to supply a ground potential, the illustration of these connections is omitted in FIG. 1.

An initial value INIT of the register circuit 100A is supplied to the initial value wiring line 110. In the register circuit 100A, the initial value wiring line 110 is connected to the terminal VCC. That is, in the register circuit 100A, the initial value INIT is set to 1.

The flip-flop (first flip-flop) 120 includes a data input terminal D, a clock terminal C, a data output terminal Q, an inverted data output terminal /Q, and a reset terminal R. In the flip-flop 120, when a reset signal goes to 1 (high level), the output of the data output terminal Q is reset to 0 and the output of the inverted data output terminal /Q is reset to 1.

In the flip-flop 120, a power supply voltage (a value of 1) is input into the data input terminal D and a clock signal is inverted and input into the clock terminal C. Therefore, at the falling edge of a clock signal, the value of 1 is latched, the output of the data output terminal Q is changed to 1, and the output (first signal) of the inverted data output terminal /Q is changed to 0.

The flip-flop 130 (second flip-flop) includes a data input terminal D, a clock terminal C, a data output terminal Q, a data inversion output terminal /Q, and a reset terminal R. In the flip-flop 130, when a reset signal goes to 1 (high level), the output of the data output terminal Q is reset to 0 and the output of the inverted data output terminal /Q is reset to 1. In the flip-flop 130, a signal F (second signal) output from the output control circuit 150 is input into the data input terminal D and a clock signal is inverted and input into the clock terminal C. Therefore, at the falling edge of a clock signal, the value of the signal F is latched and the output of the data output terminal Q is changed to the value of the signal F.

The selector 140 outputs the initial value INIT or the output of the data output terminal Q of the flip-flop 130 as an output signal in accordance with a selection signal SEL. In the register circuit 100A, the output of the data output terminal Q of the flip-flop 120 is input into the selector 140 as the selection signal SEL. In a case where the output of the data output terminal Q of the flip-flop 120 is 0 (a reset value), the selector 140 outputs the initial value INIT as an output signal. In a case where the output of the data output terminal Q of the flip-flop 120 is 1, the selector 140 outputs the output of the data output terminal Q of the flip-flop 130 as an output signal. That is, the selector 140 outputs the initial value INIT as an output signal before the output (first signal) of the inverted data output terminal /Q of the flip-flop 120 changes, and outputs the output of the data output terminal Q of the flip-flop 130 as an output signal after the output (first signal) of the inverted data output terminal /Q of the flip-flop 120 has changed.

The output control circuit 150 is a logic circuit that outputs the initial value INIT or a signal input from the terminal IN as the signal F (second signal). Specifically, the output control circuit 150 outputs the initial value INIT as the signal F (second signal) before the output (first signal) of the inverted data output terminal /Q of the flip-flop 120 changes, and outputs an input signal as the signal F (second signal) in accordance with a write signal after the output (first signal) of the inverted data output terminal /Q of the flip-flop 120 has changed.

As illustrated in FIG. 1, the output control circuit 150 can be formed with, for example, AND circuits 151 to 153, a NAND circuit 154, an OR circuit 155, and NOR circuits 156 and 157.

The output (signal A) of the data output terminal Q of the flip-flop 120 and a write signal are input into the AND circuit 151. The AND circuit 151 therefore outputs a signal C that is the logical AND of the signal A and the write signal.

The initial value INIT and the output (signal B) of the inverted data output /Q of the flip-flop 120 are input into the AND circuit 152. The AND circuit 152 therefore outputs a signal that is the logical AND of the initial value INIT and the signal B.

The signal C output from the AND circuit 151 and a signal input from the terminal IN are input into the AND circuit 153. The AND circuit 153 therefore outputs a signal that is the logical AND of the signal C and the input signal.

The signal C output from the AND circuit 151 and the output (signal B) of the inverted data output /Q of the flip-flop 120 are input into the NOR circuit 156. The NOR circuit 156 therefore outputs a signal that is the negative OR of the signal C and the signal B.

The output (signal Q) of the data output terminal Q of the flip-flop 130 and the output of the NOR circuit 156 are inverted and input into the OR circuit 155. The OR circuit 155 therefore outputs a signal that is the logical OR of the inverted signal of the signal Q and the inverted signal of the output of the NOR circuit 156.

The outputs of the AND circuits 152 and 153 are input into the NOR circuit 157. The NOR circuit 157 therefore outputs a signal D that it the negative OR of the outputs of the AND circuits 152 and 153.

The output of the OR circuit 155 and the output of the NOR circuit 157 are input into the NAND circuit 154. The NAND circuit 154 therefore outputs the signal F that is the negative AND of the output of the OR circuit 155 and the output (signal D) of the NOR circuit 157.

The configuration of the logic circuit of the output control circuit 150 illustrated in FIG. 1 is illustrative, and any configuration that realizes the same logic can be adopted.

Figure 2:
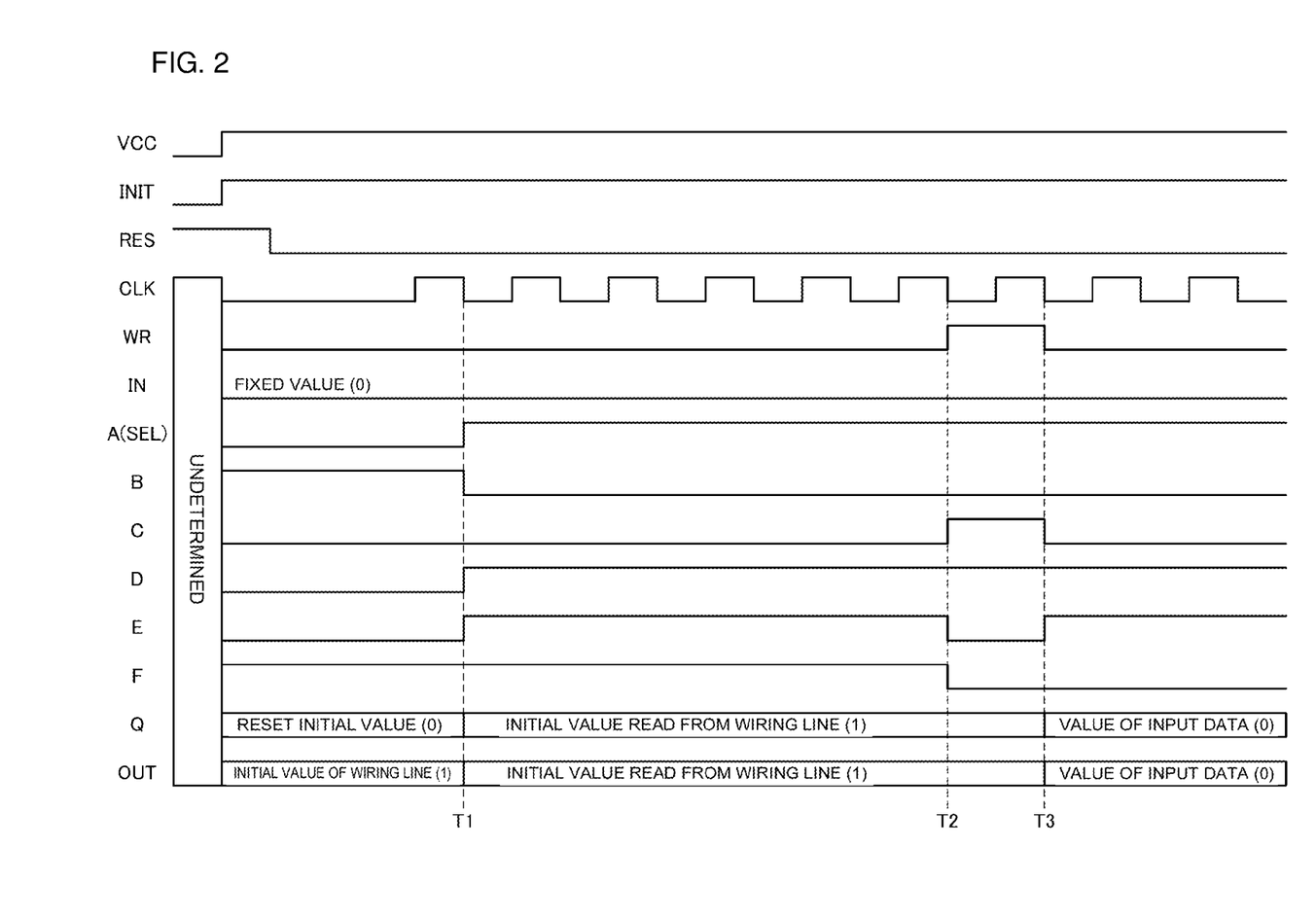
FIG. 2 is a timing chart illustrating an exemplary operation of the register circuit 100A.

FIG. 2 is a timing chart illustrating an exemplary operation of the register circuit 100A. In the timing chart illustrated in FIG. 2, the value of a signal input from the terminal IN is 0 (fixed value).

When the operation of the register circuit 100A starts, the initial value INIT to be supplied to the initial value wiring line 110 goes to 1 that is a value corresponding to a power supply voltage. In the flip-flop 120, the output (signal A) of the data output terminal Q goes to 0 and the output (signal B) of the inverted data output terminal /Q goes to 1 in accordance with a reset signal. The selector 140 therefore outputs an initial value INIT(1) of the initial value wiring line 110 from the terminal OUT.

At that time, the output (signal Q) of the data output terminal Q of the flip-flop 130 goes to 0 in accordance with the reset signal. The output (the signal F) of the output control circuit 150 goes to 1 that is a value corresponding to the initial value INIT.

After that, when a clock signal is input, the flip-flop 120 latches the value of 1 corresponding to the power supply voltage at a first falling edge (time T1). As a result, in the flip-flop 120, the output (signal A) of the data output terminal Q is changed to 1 and the output (signal B) of the inverted data output terminal /Q is changed to 0.

The flip-flop 130 latches the value of 1 of the signal F. As a result, the output (signal Q) of the data output terminal Q of the flip-flop 130 is changed to the initial value INIT(1) read from the initial value wiring line 110. Since the value of the signal A is 1, the selector 140 outputs a signal Q(1) from the terminal OUT.

Since the value of the write signal is 0 at the time T1, the output (signal C) of the AND circuit 151 remains at 0. As a result of the change in the value of the signal B to 0, the output (signal D) of the NOR circuit 157 is changed to 1 and the output (signal E) of the NOR circuit 156 is changed to 1. Since the values of the signals Q and E are 1, the value of the signal F goes to 1 (the initial value INIT of 1). This state remains until a write signal is input.

After the value of the write signal input from the terminal WR has been changed to 1 at a time T2, the output (signal C) of the AND circuit 151 is changed to 1. As a result, the output (signal E) of the NOR circuit 156 is changed to 0 and the output (signal F) of the NAND circuit 154 is changed to 0 (0 is the value of a signal input from the terminal IN). At a falling edge of the clock signal (time T3), the flip-flop 130 latches the value of 0 of the signal F (0 is the value of the signal input from the terminal IN). As a result, the output (signal Q) of the data output terminal Q of the flip-flop 130 goes to 0 that is the value of the signal input from the terminal IN. The selector 140 outputs a signal Q(0) from the terminal OUT.

Subsequently, the value (0 or 1) of an input signal is latched by the flip-flop 130 in accordance with a write signal and is then output from the terminal OUT as described above.

Thus, in the register circuit 100A, the value of 1 to be supplied to the initial value wiring line 110 can be set as an initial value. According to an embodiment of the present disclosure, there can be provided the register circuit 100A for which a value to be supplied to the initial value wiring line 110 can be set as an initial value without a flip-flop necessarily including both a set terminal and a reset terminal.

Figure 3:
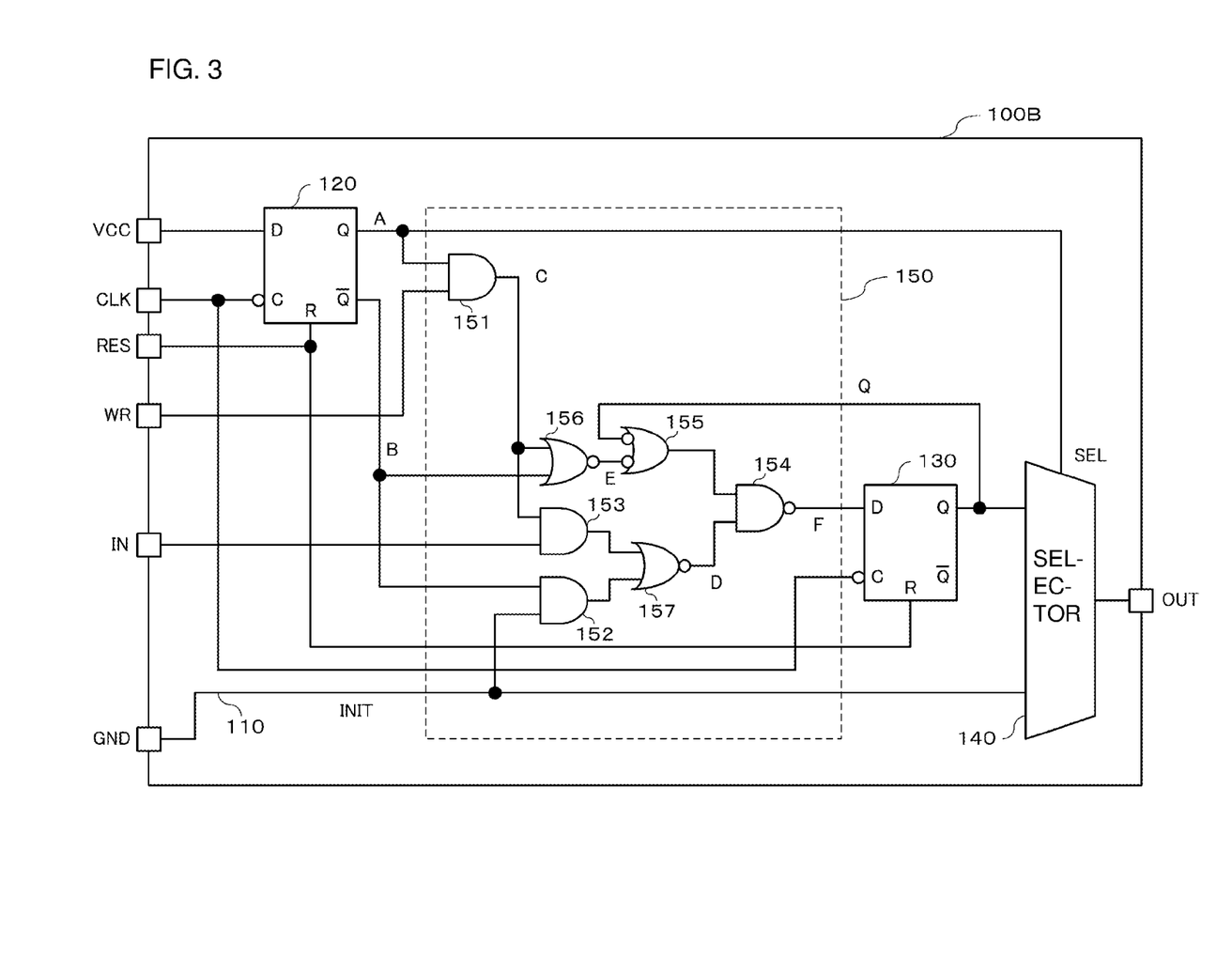
FIG. 3 is a diagram illustrating the configuration of a register circuit 100B according to another embodiment of the present disclosure.

FIG. 3 is a diagram illustrating the configuration of a register circuit 100B according to another embodiment of the present disclosure. The same reference numerals are used to identify parts already described in the register circuit 100A illustrated in FIG. 1, and the description thereof will be therefore omitted. The register circuit 100B is the same as the register circuit 100A except that the initial value wiring line 110 is connected to the terminal GND.

Figure 4:
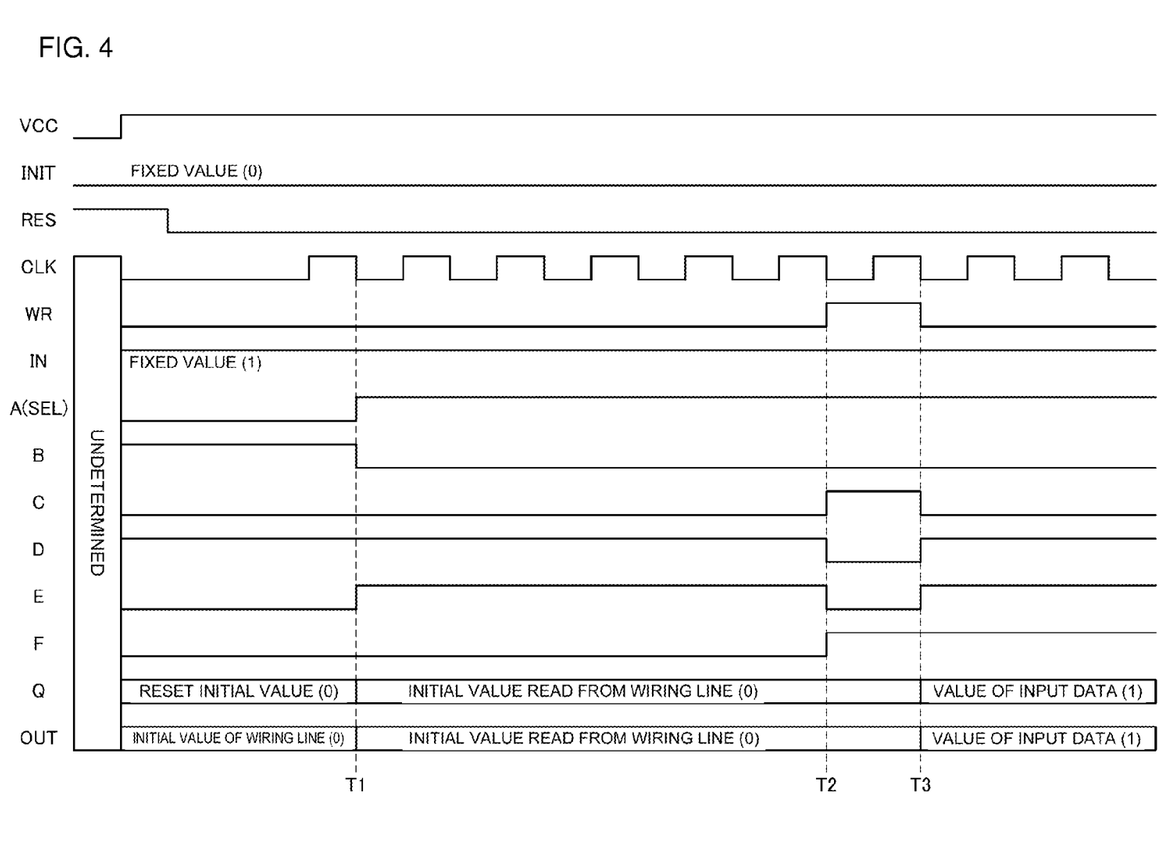
FIG. 4 is a timing chart illustrating an exemplary operation of the register circuit 100B.

FIG. 4 is a timing chart illustrating an exemplary operation of the register circuit 100B. In the timing chart illustrated in FIG. 4, the value of a signal input from the terminal IN is 1 (fixed value). The operation of the register circuit 100B will be described below while the description of a part of the operation similar to the operation of the register circuit 100A is omitted as appropriate.

Since the initial value wiring line 110 is connected to the terminal GND in the register circuit 100B, the initial value INIT to be supplied to the initial value wiring line 110 is 0 (fixed value) that is a value corresponding to a ground potential. The selector 140 therefore outputs the initial value INIT(0) of the initial value wiring line 110 from the terminal OUT. At that time, the output (signal F) of the output control circuit 150 is 0 that is a value corresponding to the initial value INIT.

After that, when a clock signal is input, the flip-flop 120 latches the value of 1 corresponding to the power supply voltage at a first falling edge (time T1). As a result, in the flip-flop 120, the output (signal A) of the data output terminal Q is changed to 1 and the output (signal B) of the inverted data output terminal /Q is changed to 0.

The flip-flop 130 latches the value of 0 of the signal F. As a result, the output (signal Q) of the data output terminal Q of the flip-flop 130 is changed to the initial value INIT(0) read from the initial value wiring line 110. Since the value of the signal A is 1, the selector 140 outputs a signal Q(0) from the terminal OUT.

After the value of the write signal input from the terminal WR has been changed to 1 at a time T2, the output (signal F) of the NAND circuit 154 is changed to 1 (1 is the value of a signal input from the terminal IN). At a falling edge of the clock signal (time T3), the flip-flop 130 latches the value of 1 of the signal F (1 is the value of the signal input from the terminal IN). As a result, the output (signal Q) of the data output terminal Q of the flip-flop 130 goes to 1 that is the value of the signal input from the terminal IN. The selector 140 outputs a signal Q(1) from the terminal OUT.

Subsequently, the value (0 or 1) of an input signal is latched by the flip-flop 130 in accordance with a write signal and is then output from the terminal OUT as described above.

According to an embodiment of the present disclosure, there can be provided the register circuit 100B for which the value of 0 set for the initial value wiring line 110 can be set as an initial value without necessarily a flip-flop including both a set terminal and a reset terminal.

As illustrated in FIGS. 1 to 4, there can be provided a register circuit for which an initial value can be changed by changing the initial value INIT set for the initial value wiring line 110 without necessarily using a flip-flop including both a set terminal and a reset terminal.

Figure 5:
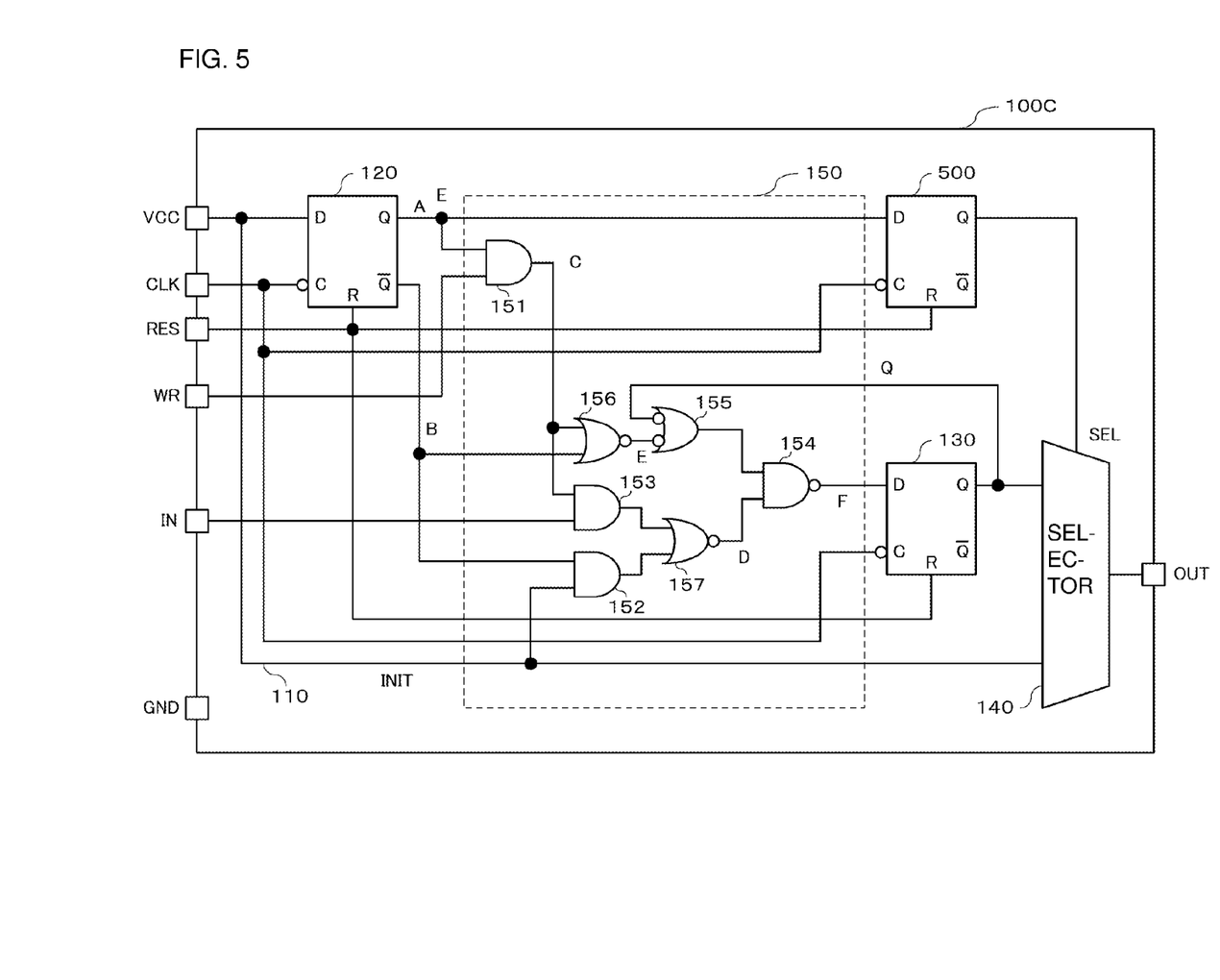
FIG. 5 is a diagram illustrating the configuration of a register circuit 100C according to another embodiment of the present disclosure.

FIG. 5 is a diagram illustrating the configuration of a register circuit 100C according to another embodiment of the present disclosure. The same reference numerals are used to identify parts already described in the register circuit 100A illustrated in FIG. 1, and the description thereof will be therefore omitted. The register circuit 100C further includes a flip-flop 500 in addition to the components included in the register circuit 100A.

The flip-flop 500 (third flip-flop) includes a data input terminal D, a clock terminal C, a data output terminal Q, a data inversion output terminal /Q, and a reset terminal R. In the flip-flop 500, when a reset signal goes to 1 (high level), the output of the data output terminal Q is reset to 0 and the output of the inverted data output terminal /Q is reset to 1. In the flip-flop 500, the output (signal A) of the data output terminal Q of the flip-flop 120 is input into the data input terminal D and a clock signal is inverted and input into the clock terminal C. Therefore, at the falling edge of a clock signal, the value of the signal A (third signal) is latched and the output (fourth signal) of the data output terminal Q is changed to the value of the signal A. The output of the data output terminal Q of the flip-flop 500 is supplied to the selector 140 as the selection signal SEL.

Figure 6:
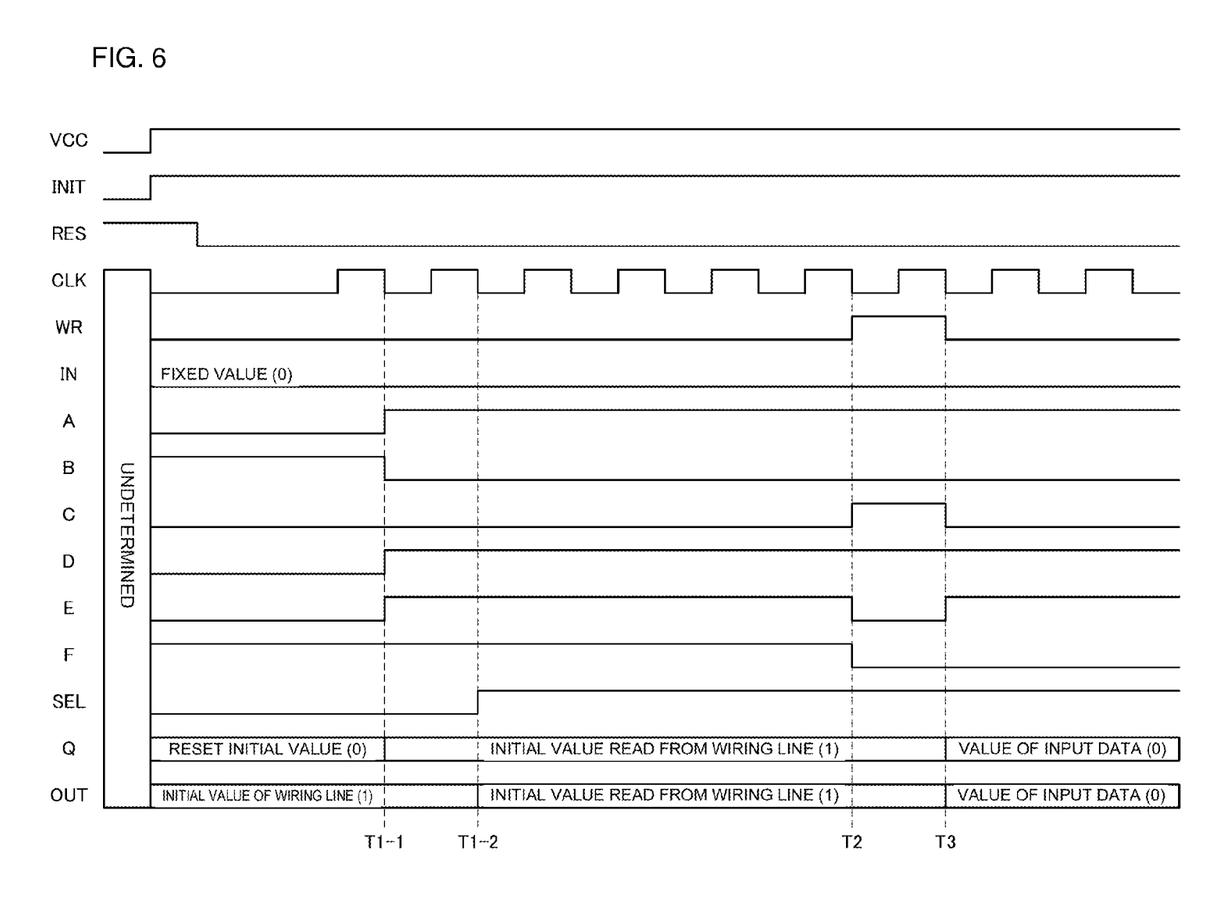
FIG. 6 is a timing chart illustrating an exemplary operation of the register circuit 100C.

FIG. 6 is a timing chart illustrating an exemplary operation of the register circuit 100C. In the timing chart illustrated in FIG. 6, the value of a signal input from the terminal IN is 0 (fixed value). The operation of the register circuit 100C will be described below while the description of a part of the operation similar to the operation of the register circuit 100A is omitted as appropriate.

When the operation of the register circuit 100C starts and a clock signal is input, the flip-flop 120 latches the value of 1 corresponding to the power supply voltage at a first falling edge (time T1-1). As a result, in the flip-flop 120, the output (signal A) of the data output terminal Q is changed to 1 and the output (signal B) of the inverted data output terminal /Q is changed to 0.

The flip-flop 130 latches the value of 1 of the signal F. As a result, the output (signal Q) of the data output terminal Q of the flip-flop 130 is changed to the initial value INIT(1) read from the initial value wiring line 110. At that time, the output (signal SEL) of the data output terminal Q of the flip-flop 500 is a reset initial value of 0. The selector 140 therefore outputs the initial value INIT(1) of the initial value wiring line 110 from the terminal OUT.

At the next falling edge of the clock signal (time T1-2), the flip-flop 500 latches 1 that is the value of the output (signal A) of the data output terminal Q. As a result, the output (signal SEL) of the data output terminal Q of the flip-flop 500 is changed to 1. The selector 140 therefore outputs 1 that is the value of the output (signal Q) of the data output terminal Q of the flip-flop 130 (the value of 1 read from the initial value wiring line 110) from the terminal OUT.

The subsequent operation is similar to that of the register circuit 100A, and the description thereof will be therefore omitted.

According to an embodiment of the present disclosure, there can be provided the register circuit 100C for which the value of 1 set for the initial value wiring line 110 can be set as an initial value without a flip-flop necessarily including both a set terminal and a reset terminal. Since the register circuit 100C includes the flip-flop 500, the register circuit 100C can stagger the latching timing (T1-1) of the flip-flop 130 and the switching timing (T1-2) of the selector 140. This can suppress noise at the time of switching by the selector 140.

Like in the register circuit 100B, by connecting the initial value wiring line 110 to the terminal GND in the register circuit 100C, the value of 0 set for the initial value wiring line 110 can be set as an initial value.

Figure 7:
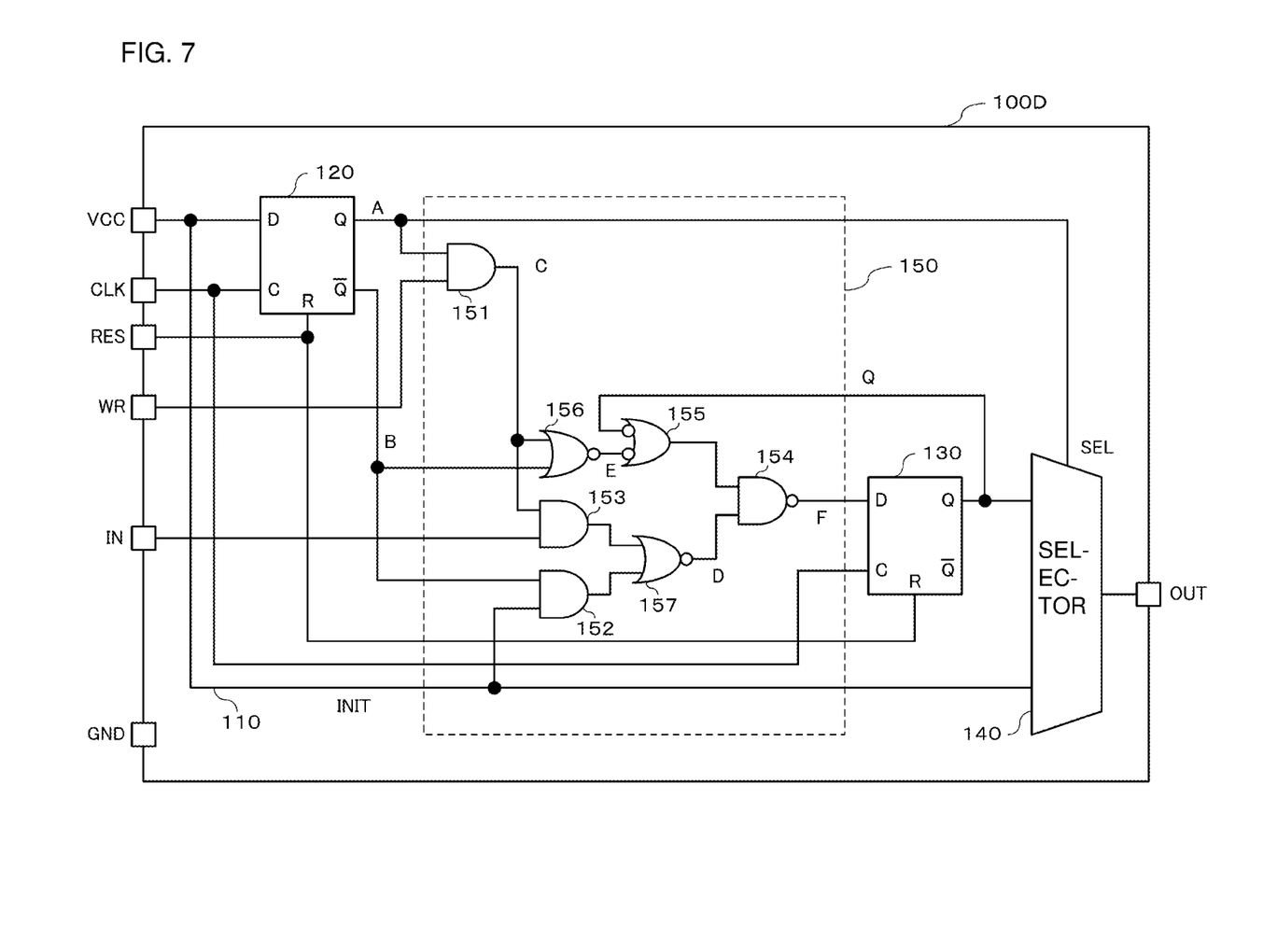
FIG. 7 is a diagram illustrating the configuration of a register circuit 100D according to another embodiment of the present disclosure.

FIG. 7 is a diagram illustrating the configuration of a register circuit 100D according to another embodiment of the present disclosure. The same reference numerals are used to identify parts already described in the register circuit 100A illustrated in FIG. 1, and the description thereof will be therefore omitted. The register circuit 100D is the same as the register circuit 100A except that clock signals are not inverted before inputting into the clock terminals C of the flip-flops 120 and 130.

Figure 8:
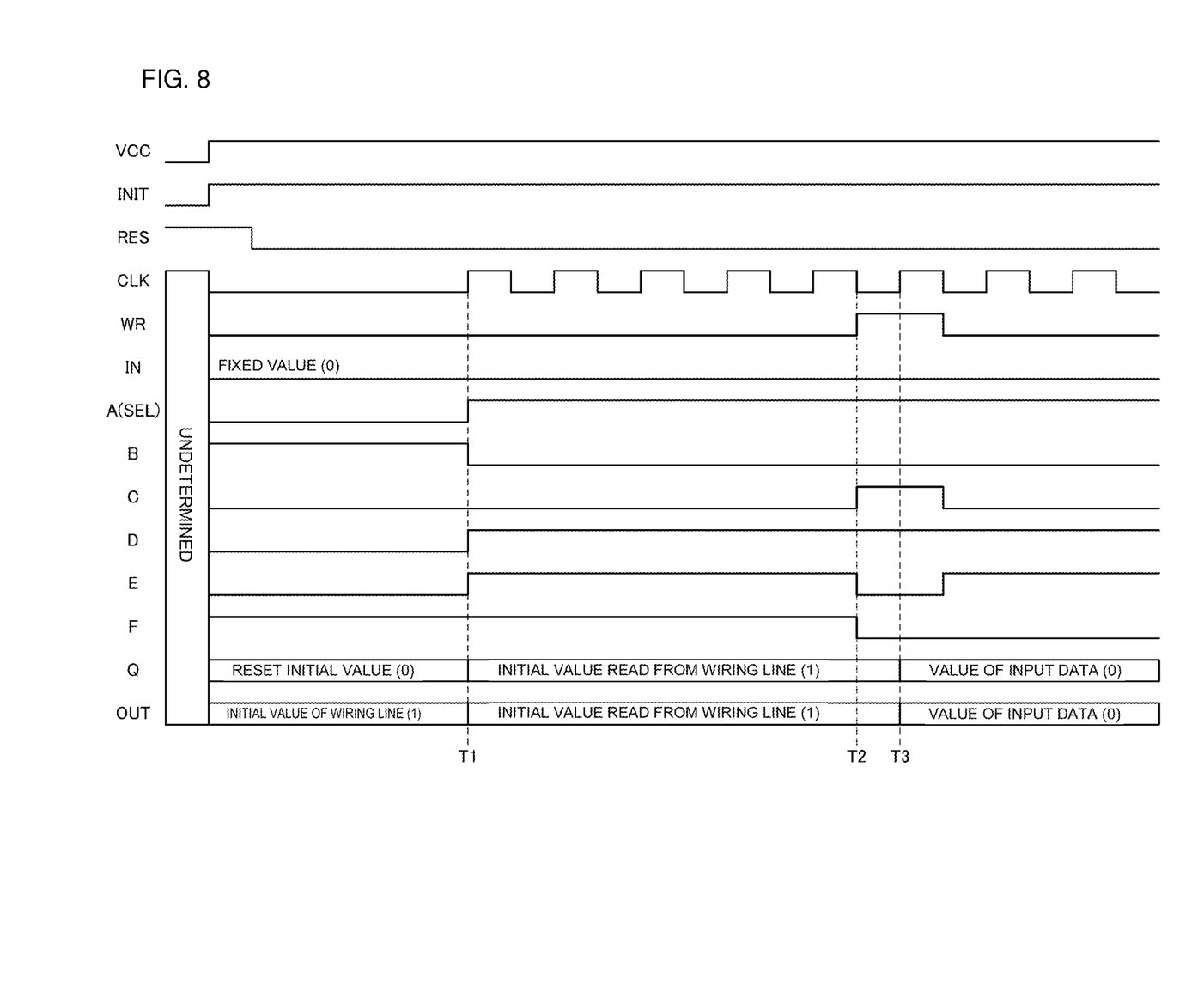
FIG. 8 is a timing chart illustrating an exemplary operation of the register circuit 100D.

FIG. 8 is a timing chart illustrating an exemplary operation of the register circuit 100D. In the timing chart illustrated in FIG. 8, the value of a signal input from the terminal IN is 1 (fixed value). The operation of the register circuit 100D will be described below while the description of a part of the operation similar to the operation of the register circuit 100A is omitted as appropriate.

When the operation of the register circuit 100D starts and a clock signal is input, the flip-flop 120 latches the value of 1 corresponding to the power supply voltage at a first rising edge (time T1). As a result, in the flip-flop 120, the output (signal A) of the data output terminal Q is changed to 1 and the output (signal B) of the inverted data output terminal /Q is changed to 0.

The flip-flop 130 latches the value of 1 of the signal F. As a result, the output (signal Q) of the data output terminal Q of the flip-flop 130 is changed to the initial value INIT(1) read from the initial value wiring line 110. Since the value of the signal A is 1, the selector 140 outputs a signal Q(1) from the terminal OUT.

After the value of the write signal input from the terminal WR has been changed to 1 at a time T2, the output (signal F) of the NAND circuit 154 is changed to 0 (0 is the value of a signal input from the terminal IN). At a subsequent rising edge of the clock signal (time T3), the flip-flop 130 latches the value of 0 of the signal F (0 is the value of the signal input from the terminal IN). As a result, the output (signal Q) of the data output terminal Q of the flip-flop 130 goes to 0 that is the value of the signal input from the terminal IN. The selector 140 outputs a signal Q(0) from the terminal OUT.

Subsequently, the value (0 or 1) of an input signal is latched by the flip-flop 130 in accordance with a write signal and is then output from the terminal OUT as described above.

According to an embodiment of the present disclosure, there can be provided the register circuit 100D for which the value of 1 set for the initial value wiring line 110 can be set as an initial value without a flip-flop necessarily including both a set terminal and a reset terminal.

Like in the register circuit 100B, by connecting the initial value wiring line 110 to the terminal GND in the register circuit 100D, the value of 0 set for the initial value wiring line 110 can be set as an initial value. Like in the register circuit 100D, latching can be performed at a rising edge of a clock in the register circuit 100C.

Embodiments of the present disclosure have been described. According to embodiments of the present disclosure, there can be provided the register circuits 100A to 100D for which an initial value can be changed by changing a value set for the initial value wiring line 110 without necessarily using a flip-flop including both a set terminal and a reset terminal.

Although a flip-flop including a reset terminal is used in the register circuits 100A to 100D, a flip-flop including a set terminal can be used.

In the register circuit 100C including the flip-flop 500 (third flip-flop), the latching timing of the flip-flop 130 and the switching timing of the selector 140 can be staggered. This can suppress noise at the time of switching by the selector 140.

In the register circuits 100A to 100D, a value set for the initial value wiring line 110 can be changed by connecting the initial value wiring line 110 to the terminal VCC or the terminal GND. The change in the connection destination of the initial value wiring line 110 can change the initial value of a register circuit. A terminal into which a value to be set for the initial value wiring line 110 is input may be additionally provided.

The embodiments described above are provided for facilitating the understanding of the invention, but are not intended to be exhaustive or to limit the invention to the precise forms disclosed. Modifications and/or improvements may be made to the invention without departing from the scope and spirit of the invention, and equivalents of the invention are also encompassed in the invention. That is, suitable design changes made to the embodiments by those skilled in the art are also encompassed in the invention as long as they are within the scope and spirit of the invention. For example, the elements of the embodiments and the positions, materials, conditions, configurations, and sizes thereof are not restricted to those described in the embodiments and may be changed in an appropriate manner. The elements of the embodiments may be combined as long as such combinations are technically possible, and configurations obtained by combining the elements of the embodiments are also encompassed in the invention as long as they are within the scope and spirit of the invention.

REFERENCE SIGNS LIST 100A, 100B, 100C, and 100D register circuit
110 initial value wiring line
120, 130, and 500 flip-flop
140 selector
150 output control circuit
151 to 153 AND circuit
154 NAND circuit
155 OR circuit
156 and 157 NOR circuit

The invention claimed is:
1. A register circuit into which an input signal is input and from which an output signal is output comprising:
    an initial value wiring line configured to supply an initial value signal having an initial value of the output signal;
    an input terminal into which the input signal is input;
    a write signal terminal into which a write signal instruction for writing the input signal is input;
    a clock signal terminal into which a clock signal is input;

a first flip-flop configured to change a first signal from a first value to a second value in accordance with the clock signal;

an output control circuit configured to output a second signal, the second signal having the initial value when the first signal has the first value, and the second signal having a value of the input signal, in accordance with the write signal, when the first signal has the second value;

a second flip-flop configured to latch and output the second signal in accordance with the clock signal; and a selector configured to output the initial value signal as the output signal when the first signal has the first value and to output the second signal supplied from the second flip-flop as the output signal when the first signal has the second value.

2. The register circuit according to claim 1, further comprising a third flip-flop configured to latch a third signal corresponding to the first signal in accordance with the clock signal to change a value of a fourth signal, and wherein the selector changes the output signal from the initial value signal to the second signal supplied from the second flip-flop in accordance with the change in the value of the fourth signal.

3. The register circuit according to claim 2, further comprising:

a power terminal to which a power supply voltage is supplied; and a grounding terminal connected to ground, wherein the initial value wiring line is connected to the power terminal or the grounding terminal.

4. The register circuit according to claim 3, wherein the output control circuit comprises:

a first AND gate to which the write signal and an output of the first flip-flop are input;

a first NOR gate to which an output of the first AND gate and the first signal are input;

a second AND gate to which the output of the first AND gate and the input signal are input;

a third AND gate to which the first signal and the initial value signal are input;

an OR gate to which an output of the first NOR gate and an output of the second flip-flop are input at inverting inputs;

a second NOR gate to which an output of the second AND gate and an output of the third AND gate are input; and a NAND gate to which an output of the OR gate and an output of the second NOR gate are input, wherein the second signal is an output of the NAND gate.

5. The register circuit according to claim 2, wherein the output control circuit comprises:

a first AND gate to which the write signal and an output of the first flip-flop are input;

a first NOR gate to which an output of the first AND gate and the first signal are input;

a second AND gate to which the output of the first AND gate and the input signal are input;

a third AND gate to which the first signal and the initial value signal are input;

an OR gate to which an output of the first NOR gate and an output of the second flip-flop are input at inverting inputs;

a second NOR gate to which an output of the second AND gate and an output of the third AND gate are input; and a NAND gate to which an output of the OR gate and an output of the second NOR gate are input, wherein the second signal is an output of the NAND gate.

6. The register circuit according to claim 1, further comprising:

a power terminal to which a power supply voltage is supplied; and a grounding terminal connected to ground, wherein the initial value wiring line is connected to the power terminal or the grounding terminal.

7. The register circuit according to claim 6, wherein the output control circuit comprises:

a first AND gate to which the write signal and an output of the first flip-flop are input;

a first NOR gate to which an output of the first AND gate and the first signal are input;

a second AND gate to which the output of the first AND gate and the input signal are input;

a third AND gate to which the first signal and the initial value signal are input;

an OR gate to which an output of the first NOR gate and an output of the second flip-flop are input at inverting inputs;

a second NOR gate to which an output of the second AND gate and an output of the third AND gate are input; and a NAND gate to which an output of the OR gate and an output of the second NOR gate are input, wherein the second signal is an output of the NAND gate.

8. The register circuit according to claim 1, wherein the output control circuit comprises:

a first AND gate to which the write signal and an output of the first flip-flop are input;

a first NOR gate to which an output of the first AND gate and the first signal are input;

a second AND gate to which the output of the first AND gate and the input signal are input;

a third AND gate to which the first signal and the initial value signal are input;

an OR gate to which an output of the first NOR gate and an output of the second flip-flop are input at inverting inputs;

a second NOR gate to which an output of the second AND gate and an output of the third AND gate are input; and a NAND gate to which an output of the OR gate and an output of the second NOR gate are input, wherein the second signal is an output of the NAND gate.

* * * * *